(12) United States Patent
Wong et al.

(10) Patent No.: US 8,779,443 B2
(45) Date of Patent: Jul. 15, 2014

(54) OVERMOLD WITH SINGLE ATTACHMENT USING OPTICAL FILM

(71) Applicant: STMicroelectronics Pte Ltd., Singapore (SG)

(72) Inventors: Wing Shenq Wong, Singapore (SG); Hk Looi, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 0 days.

(21) Appl. No.: 13/629,379

(22) Filed: Sep. 27, 2012

(65) Prior Publication Data

US 2014/0084308 A1    Mar. 27, 2014

(51) Int. Cl.
*H01L 27/15* (2006.01)
(52) U.S. Cl.
USPC ............................................................ 257/84

(58) Field of Classification Search
CPC ...................................................... H01L 25/167
USPC .................................................. 257/79–84, 98
See application file for complete search history.

(56) References Cited

U.S. PATENT DOCUMENTS

| | | | |
|---|---|---|---|
| 8,093,609 B2 * | 1/2012 | Hand et al. ...................... 257/98 |
| 2004/0211971 A1 * | 10/2004 | Takei et al. ...................... 257/98 |
| 2012/0248625 A1 * | 10/2012 | Coffy et al. .................... 257/774 |
| 2012/0290255 A1 * | 11/2012 | Kelkar et al. .................. 702/150 |

* cited by examiner

*Primary Examiner* — Matthew Reames
*Assistant Examiner* — John Bodnar
(74) *Attorney, Agent, or Firm* — Seed IP Law Group PLLC (57) ABSTRACT

A sensor package is provided having a light sensitive component and a light emitting component attached to a same substrate. Light from the light emitting component is emitted from the package through a first opening and reflected back into the package to the light sensitive component through a second opening in the package. A glass attachment is placed between the light emitting component and the light sensitive component. A portion of the glass is removed and filled with an opaque substance to prevent light travelling between the light emitting component and the light sensitive component in the package.

17 Claims, 7 Drawing Sheets

OVERMOLD WITH SINGLE ATTACHMENT USING OPTICAL FILM

BACKGROUND

1. Technical Field

The present disclosure relates to the field of packaged optical sensors. The present disclosure relates more particularly to the field of optical sensors having first and second semiconductor optoelectronic devices on a substrate.

2. Description of the Related Art

Optical sensors are used in many applications, such as cameras, smart phones, tablet computers, measurement devices, atomic force microscopes, and many other kinds of applications. Some optical sensors include a light emitting component and a light sensing component in a same device. For example, some optical sensors have a light emitting semiconductor device and a light sensing semiconductor device on a same substrate. The light emitting device emits light which is then reflected or scattered by an outside object. Some portion of the reflected light is then incident on the light sensing device. In this manner, various types of measurement or sensing arrangements are implemented.

Figure 1A:
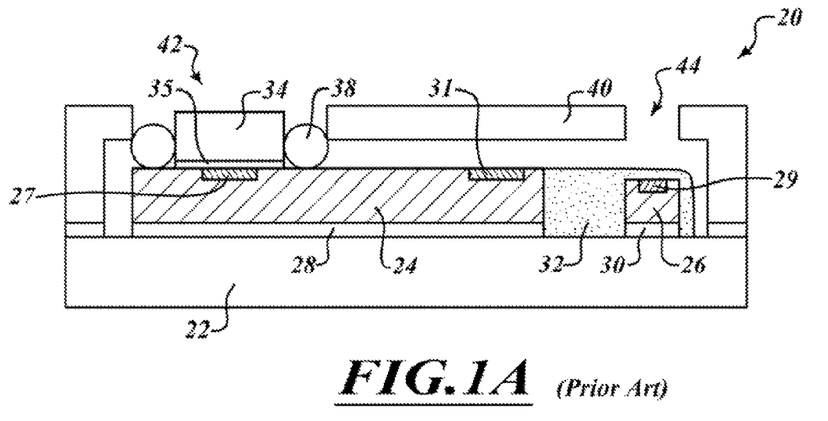
FIGS. 1A-1C are cross-sections of known optical sensors.

FIG. 1A is a cross-section of an optical sensor 20 including a first integrated circuit die 24 and a second integrated circuit die 26 coupled to a substrate 22. The first integrated circuit die 24 includes a light sensor 27 formed therein. The first integrated circuit die 24 also includes a reference light sensor 31. The first integrated circuit die 24 is attached to the substrate 22 by a die attach film 28. The second integrated circuit die 26 includes a light emitting portion 29. The second integrated circuit die 26 is attached to the substrate 22 by a conductive glue 30. The light emitting portion 29 is, for example, a laser diode. The second integrated circuit die 26 is covered by an adhesive glue 32. The adhesive glue 32 is transparent to the type of light being emitted by the second integrated circuit die 26. A transparent component 34 is placed on a light sensing portion of the first integrated circuit die 24. The transparent component 34 protects the light sensor 27 of the first integrated circuit die 24 while also being transparent so that light may pass through the transparent component 34 and be incident upon the sensing portion of the first integrated circuit die 24. The transparent component 34 is attached to the first integrated circuit die 24 by adhesive glue 35. The adhesive glue 35 is, for example, the same material as the glue 32.

The glues 35 and 32 are cured by irradiation from ultraviolet light, as well as thermal treatment. Problems can arise from shifting of the component 34 when placed on the glue 35 prior to curing. Furthermore, the glue 35 can be unevenly applied and can spread in an undesirable manner over other portions of the first integrated circuit die 24. An opaque adhesive 38 also couples the transparent component 34 to the integrated circuit die 24. A conventional MEMS cap 40 is attached to the substrate 22. The MEMS cap 40 includes openings 42 and 44. The opening 44 allows for light emitted from the integrated circuit die 26 to pass through the MEMS cap 40 to be reflected or scattered and then to be incident on the integrated circuit die 24 through the opening 42.

The optical sensor 20 of FIG. 1A suffers from many drawbacks including running of the glue as described previously, non-precise control of the glue and bond line thickness, and component shift before curing of the glue. Also, the opening spaces between the integrated circuit dies 24 and 26 and the MEMS cap 40 can allow for damage and contamination of the integrated circuit dies 24 and 26.

Figure 1B:
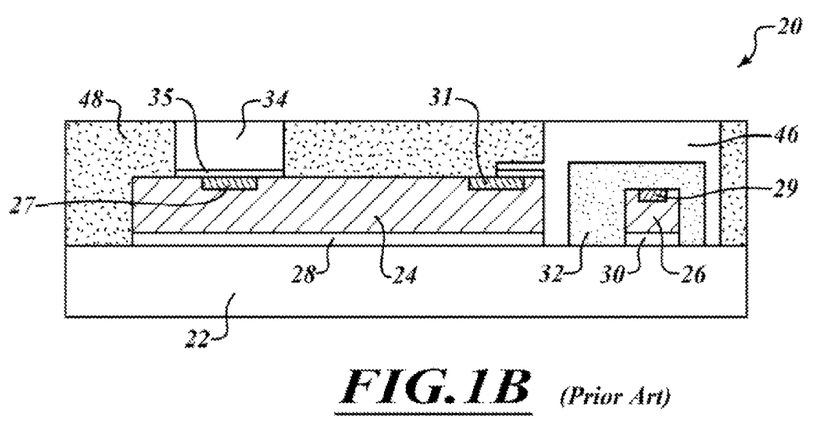

FIG. 1B is an optical sensor 20 which lacks the MEMS cap 40 but includes molding compound 48 covering the substrate 22 and the integrated circuit die 24. A transparent mold component 46 covers the glue 32 over the integrated circuit die 26. The mold component 46 is transparent so that light emitted by the integrated circuit die 26 can pass from the optical sensor 20 to be reflected and scattered back and sensed by the first integrated circuit die 24. The optical sensor 20 of FIG. 1B also suffers from the drawback that the transparent mold component 46 is also an ultraviolet filter. The glue 32 is cured by irradiation by ultraviolet. Because the transparent mold component 46 is an ultraviolet filter, the adhesive 32 is only partially cured during irradiation by the ultraviolet light. With the glue only partially cured, components may shift and the glue may bleed into other parts of the optical sensor 20.

Figure 1C:
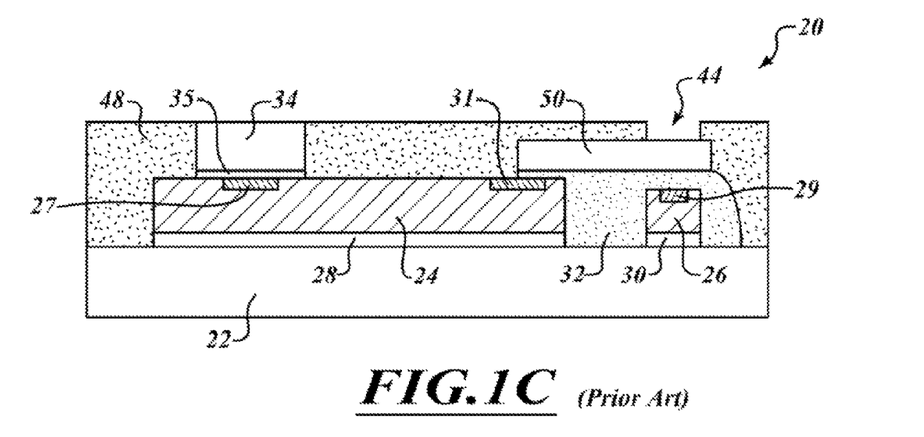

FIG. 1C is an optical sensor 20 in which a second transparent component 50 has been placed on the adhesive 32 over the second integrated circuit die 26. The second transparent component 50 is of the same material as the transparent component 34, for example, glass. Molding compound covers the second transparent component 50. An opening 44 is made in the molding compound 48 by laser drilling. However, laser drilling ads extra expense to the manufacturing process. Laser drilling also can damage other components of the optical sensor package 20.

BRIEF SUMMARY

One embodiment is an optical sensor including a light sensing integrated circuit die and a light emitting integrated circuit die, each coupled to a substrate. The optical sensor includes a protective structure which is prepared separately and then placed on the light sensing integrated circuit die and the light emitting integrated circuit die. In one embodiment, the protective structure includes a transparent component having a first portion and a second portion each attached to an adhesive transparent optical film which also couples the transparent component to the light sensing integrated circuit die. An opening is formed in the transparent component between the first and the second portions. The transparent component is placed on an adhesive transparent optical film. An opaque cap is positioned on the transparent component. The opaque cap includes a first aperture and a second aperture. The protective structure is coupled to the light sensing integrated circuit die and the second integrated circuit die by the optical film. The protective structure is positioned so that the transparent component is between the protective cap and the integrated circuit dies. The apertures in the protective cap are positioned such that light emitted from the second integrated circuit die will pass through the second portion of the transparent component and through the second aperture. The light is then scattered or reflected by an object outside of the optical sensor and then passes through the first aperture and through the first portion of the transparent component to be incident on the light sensing integrated circuit die. Molding compound is positioned in the opening between the first and second portions of the transparent component. The molding compound prevents light emitted from the second integrated circuit die from reaching the light sensing integrated circuit die through the transparent component without first passing through the first and second apertures.

DETAILED DESCRIPTION

Figure 2A:
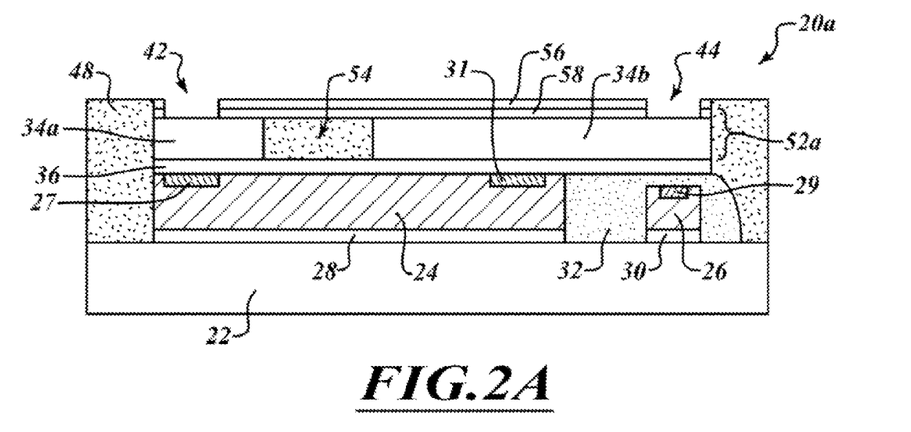
FIG. 2A is a cross-section of an optical sensor having a protective structure placed over the light sensing and light emitting integrated circuit dies according to one embodiment.

FIG. 2A is a cross-section of an optical sensor 20a according to one embodiment. The optical sensor 20a includes a substrate 22, a first integrated circuit die 24 on the substrate 22, and a second integrated circuit die 26 on the substrate 22. The first integrated circuit die 24 includes a light sensor 27. The first integrated circuit die 24 is coupled to the substrate 22 by a die attach film 28. The second integrated circuit die 26 includes a light emitter 29. The second integrated circuit die 26 is attached to the substrate 22 by a conductive glue 30 and covered in a glue 32. A protective structure 52 is positioned on the first integrated circuit die 24 and on the glue 32 above the second integrated circuit die 26.

The protective structure 52 includes a first transparent component 34a and a second transparent component 34b on a transparent adhesive optical film 36. An opening 54 between the first and second transparent components 34a and 34b is filled with molding compound 48. An opaque cap or baffle 56 is coupled to a top surface of the transparent components 34a and 34b by a baffle tape 58. A first aperture 42 and a second aperture 44 are formed in the opaque cap 56 and in the baffle tape 58.

The light emitter 29 of the second integrated circuit die 26 emits light which passes through the glue 32, the optical film 36, the second transparent component 34b and through the aperture 44. The light then reflects or scatters from an external object. Some of the light which scatters or reflects from the object passes through the first aperture 42, through the first transparent component 34a, through the optical film 36 and onto the light sensor 27 of the first integrated circuit die 24. In this way, the optical sensor 20a can function to detect objects, shapes, or topography of a surface external to the optical sensor 20a. In one embodiment, the light sensor 27 includes an array of light sensitive microlenses on a portion of the integrated circuit die 24 below the aperture 42. The light sensitive microlenses can detect the scattered or reflective light and generate signals within the integrated circuit die 24. Circuitry within the integrated circuit die 24 can process electrical signals generated from the array of microlenses and generate an output signal. The light emitter 29 of the second integrated circuit die 26 is, for example, a laser diode configured to emit a particular wavelength or wavelengths of light through a top surface of the integrated circuit die 26 and out through the aperture 44 as described previously. The substrate 22 can be any suitable substrate such as a printed circuit board, an organic substrate, or any other suitable substrate. The substrate 22 can include wire bonding pads for connection with the integrated circuit dies 24 and 26, signal traces, plated through-holes, or any other suitable electronic connection structure.

In one embodiment the protective structure 52a is assembled prior to attachment in the optical sensor 20a. The protective structure 52a is placed completely intact on the integrated circuit die 24 and the glue 32. The first and second transparent components 34a and 34b are, in one example, glass components which have been sawed apart and then placed on the optical film 36 with an opening 54 between them. The optical film 36 is, in one example, an optical tape. The opaque cap 56 is then placed on the glass components 34a and 34b. The opaque cap 56 inhibits light from passing from the second integrated circuit die through the glass components 34a and 34b to the light sensing integrated circuit die, except through the apertures 42 and 44. Once assembled, the protective structure 52a is placed on the integrated circuit die 24 and the glue 32, as described previously. The opaque cap 56 is, for example, a baffle made of plastic, polyester, or any other suitable material which will be opaque to light and provide protection for the optical sensor 20a.

After attachment of the protective structure 52a on top of the integrated circuit dies 24 and 26, the substrate 22 is covered in a molding compound 48. The molding compound 48 protects the optical sensor 20a and, in particular, the integrated circuit dies 24 and 26, from moisture damage, from thermal damage, or from any other kind of damage. The molding compound 48 also fills the opening 54 between the first and second transparent components 34a and 34b. The molding compound 48 in the opening 54 inhibits light from passing through the second transparent component 34b to the first transparent component 34a and into the light sensing portion of the first integrated circuit die 24 without first passing through the apertures 44 and 42. Without the presence of the opaque molding compound 48, light could scatter from the various materials and interfaces in the optical sensor 20a and pass through the transparent components 34a and 34b to interact with the light sensor 27 of the integrated circuit die 24. This would cause the optical sensor 20a to have erroneous readings of incoming light. The sensor therefore could detect objects, surfaces, or shapes that are not in fact there, thereby reducing the functionality and utility of the optical sensor 20a. The reference light sensor 31 is included as a reference for the light sensor 27. Any measurement of light incident on the light sensor 27 can be made with comparison to the reference light sensor 31, thereby improving accuracy.

The use of the protective structure 52a in the optical sensor 20a provides several benefits. For example, glue is not used to attach the transparent components 34a and 34b. This eliminates the possibility of the components 34a, 34b moving during placement of the transparent components 34a and 34b due to the glue still being wet. This also protects against glue spreading into areas where it should not spread, thereby damaging the optical sensor 20a. There is no need for a laser drill or any other type of drilling in order to form the aperture 44, but rather the opaque baffle 56 can be pre-patterned prior to attachment to the first and second transparent components 34a and 34b. The protective structure 52a can also be easily visually aligned with the second integrated circuit die 26. The first and second transparent components 34a and 34b allow UV rays to pass through, thereby avoiding problems with glue voids and eliminating the need for a MEMS cap 40. Because of the use of the optical film 36, no glue bleeds onto bonding wires or other electrical connections.

Figure 2B:
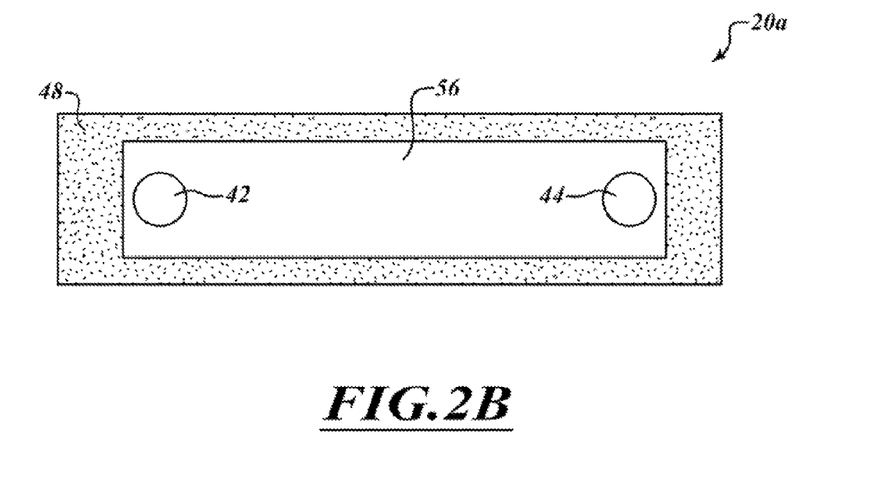
FIG. 2B is a top view of the optical sensor of FIG. 2A.

FIG. 2B is a top view of the optical sensor 20a of FIG. 2A. As can be seen in the top view, only the opaque baffle 56, molding compound 48, and apertures 42 and 44 are visible. The molding compound 48 encapsulates the components of the optical sensor 20, protecting them from outside damage, as described previously. The opaque baffle 56 with apertures 42 and 44 allows a protective structure to guard the top of the optical sensor 20a while allowing light to exit through aperture 44 and enter through aperture 42, after being reflected by an external object. The opaque baffle 56 prevents light from entering the optical sensor 20a, except through the aperture 42 or 44. The opaque cap 56 also is sturdy and protects the optical sensor 20a from damage.

Figure 3:
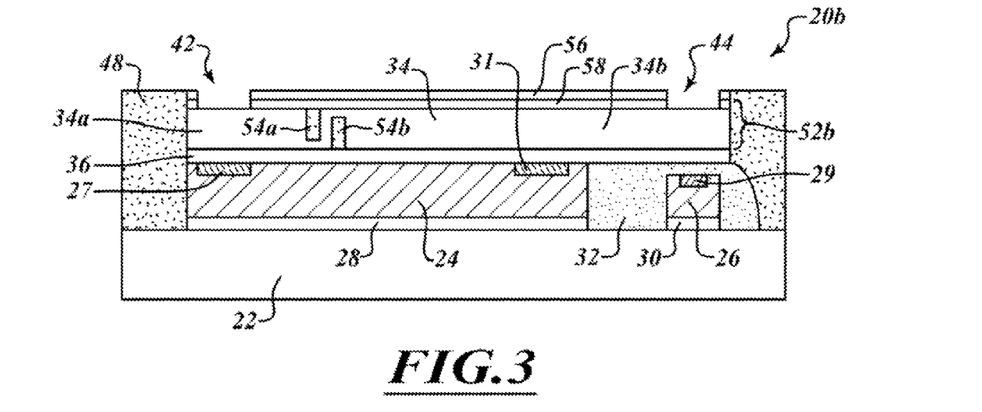
FIG. 3 is a cross-section of an optical sensor having trenches in opposite surfaces of a transparent component.

FIG. 3 illustrates an optical sensor 20b including a transparent component 34, according to an alternative embodiment. The optical sensor 20b of FIG. 3 is similar to the optical sensor of FIG. 2A, except that the protective structure 52b includes a transparent component 34, including transparent components 34a and 34b, which are structurally connected to each other. The first and second transparent components 34a and 34b therefore are a single integral structure. Openings 54a and 54b have been formed in the transparent component 34. The openings 54a and 54b are trenches which have each been formed in opposite surfaces of the transparent component 34. The trench 54a has been formed in a top surface of transparent component 34 and does not extend all the way to the bottom surface of the transparent component 34. Similarly, the trench 54b has been formed in the bottom surface of the transparent component 34 and does not extend all the way to the top surface of the transparent component 34.

When the molding compound 48 is applied to the optical sensor 20b, it fills the trenches 54a and 54b as shown in FIG. 3. In one embodiment the molding compound is applied as a liquid. The trenches 54a and 54b extend across a width of the transparent component 34 leaving openings on the sides of the transparent component 34. Molding compound 48, initially in the liquid form, enters into the trenches 54a and 54b through these openings on the side and fills the trenches 54a and 54b. The molding compound 48 is then cooled and cured leaving a solid robust structure to protect the optical sensor 20b. The positioning of these trenches and the filling with the opaque molding compound 48 serves to inhibit light emitted from the light emitter 29 from passing through the transparent component 34 to the sensitive area of the first integrated circuit die 24 without first passing through the aperture 44 and the aperture 42. Because the transparent component 34 comprises a single integral structure on the optical film 36, the optical sensor 20b has increased robustness. Furthermore, there is no danger of incorrectly spacing transparent components 34a and 34b from each other when applying them to the optical film 36, because they are part of a single transparent component 34. The optical film 36 allows for adhesion of the protective structure 52a without glue.

The opaque cap or baffle 56 is coupled to the transparent component 34 as described previously in relation to FIG. 2A. A protective structure 52b can be placed as a single component on the integrated circuit die 24 and the glue 32 as described previously. This provides for many of the same benefits described in relation to FIG. 2A as well as new benefits of increased robustness and increased protection against misaligning or misplacing transparent components 34a and 34b on the optical film 36. A top view of the optical sensor 20 of FIG. 3 is not provided but would look more or less identical to the top view of the optical sensor 20b of FIG. 2A as shown in FIG. 2B.

Figure 4A:
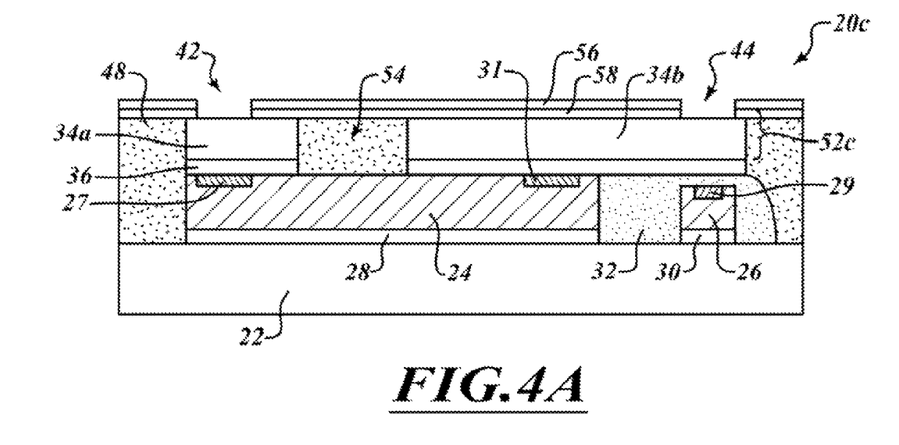
FIG. 4A is a cross-section of an optical sensor having two separate portions of a transparent component placed on separate optical films according to one embodiment.

FIG. 4A illustrates an optical sensor 20 including a protective structure 52c according to an alternate embodiment. The optical sensor 20c of FIG. 4A is similar to the optical sensor 20c of FIG. 2A. The first and second transparent components 34a and 34b of the optical component are identical to that of FIG. 2A. However, in FIG. 4A, first and second transparent components of the optical component are attached to the integrated circuit die 24 and the adhesive 32 prior to attachment of the opaque baffle 56. Thus, in FIG. 4A, after attachment of the integrated circuit dies 24 and 26 to the surface 22 and application of the glue 32, the first and second transparent components of the transparent component are attached to the integrated circuit dies by the optical film 36. After attachment of the first and second transparent components 34a and 34b, molding compound 48 is applied to the optical sensor 20c. The molding compound 48 covers the substrate 22 and fills the opening 54 between the first and second transparent components 34a and 34b.

After the molding compound 48 has been applied to the optical sensor 20c, the opaque baffle 56 is attached to the top surface of the optical sensor 20c. The opaque baffle 56 is attached to the molding compound and to the first and second transparent components of the transparent component 34a and 34b. The opaque baffle 56 includes apertures 42 and 44, as described previously.

The optical sensor 20c of FIG. 4A functions in substantially the same manner as the optical sensor 20c of FIG. 2A. The apertures 42 and 44 of the opaque baffle 56 can be visually aligned with the second integrated circuit die 26 or can be aligned by using alignment marks or any other suitable method for alignment. The apertures 42 and 44 are aligned to allow light from the light emitter 29 of the second integrated circuit die 26 to pass through the aperture 44, to reflect from an external object, and then to enter the optical sensor 20c through the aperture 42, and to be sensed by the first integrated circuit die 24, as described previously.

Figure 4B:
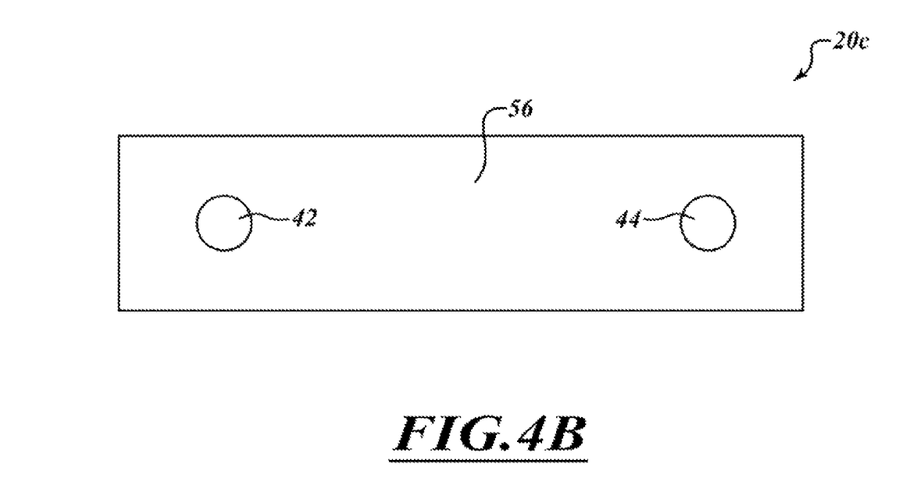
FIG. 4B is a top view of the optical sensor of FIG. 4A.

FIG. 4B is a top view of the optical sensor 20c of FIG. 4A. Only the opaque baffle 56 and the apertures 42 and 44 are visible from the top view. This is because the baffle 56 has been placed on the optical sensor 20c after application of the molding compound 48. Therefore, the opaque baffle 56 is on top of the molding compound 48 and the first and second transparent components 34a and 34b.

Figure 5:
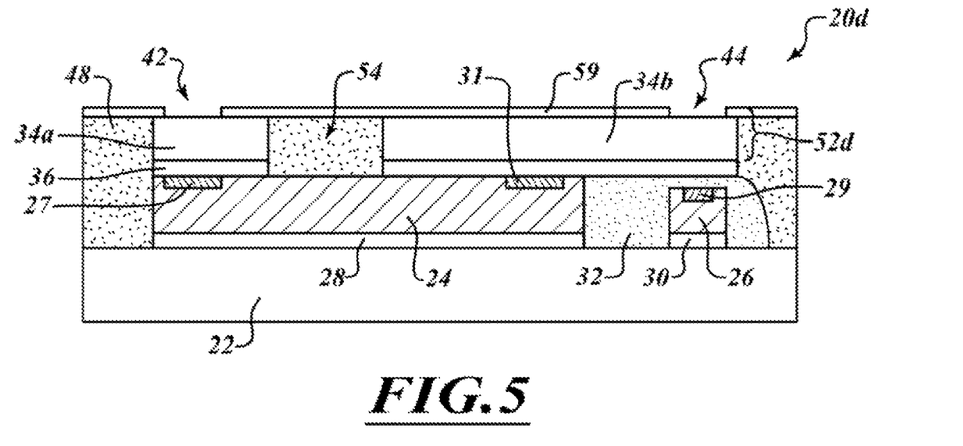
FIG. 5 is a cross-section of an optical sensor having a protective ink on a top portion thereof according to one embodiment.

FIG. 5 is a cross-section of an optical sensor 20d according to an alternative embodiment. The optical sensor 20d is similar to the optical sensor 20a of FIG. 2A with slight modifications. The optical sensor 20d includes integrated circuit dies 24 and 26 on a substrate 22 as described previously. The optical sensor 20d also includes a protective structure 52d. The protective structure 52d includes first and second transparent components 34a and 34b of a transparent component 34. The first and second transparent components 34a and 34b are each on a separate optical film 36. Therefore, the first transparent component 34a is placed separately from the second transparent component 34b on the integrated circuit die 24.

Molding compound 48 is then applied to the optical sensor 20d as described previously. The molding compound 48 fills the opening 54 between the transparent components 34a and 34b. This inhibits light from passing from the light emitter 29 of the second integrated circuit die 26 to the light sensor 27 first integrated circuit die 24 without having first passed through the apertures 44 and 42.

A thin layer of ink 59 is printed on the top surface of the molding compound 48 and the first and second transparent components 34a and 34b. The ink 59 is opaque and does not allow light to pass through except through the apertures in the ink 44 and 42. No tape is needed to attach the ink 59 to the molding compound 48 and the transparent components 34a and 34b. The ink is much thinner than the baffle and is easily printed. However, the ink 59 is not structurally robust like the baffle 56.

Figure 6A:
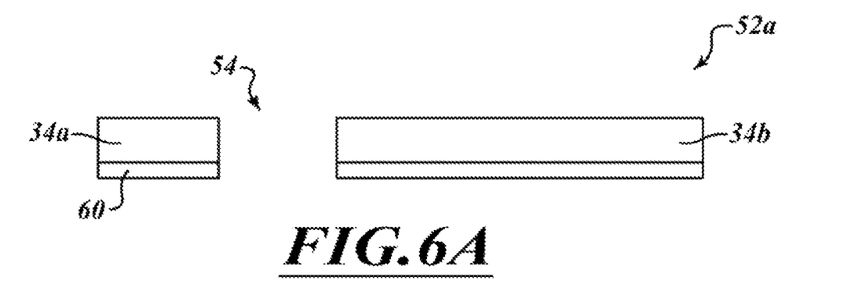
FIGS. 6A-6D illustrate steps for forming a protective structure of an optical sensor according to one embodiment.
Figure 6B:
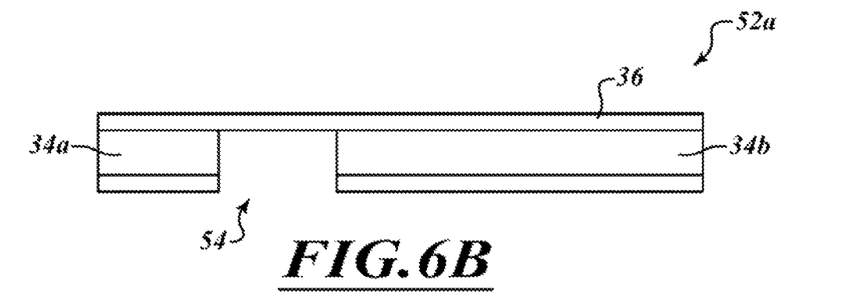
Figure 6C:
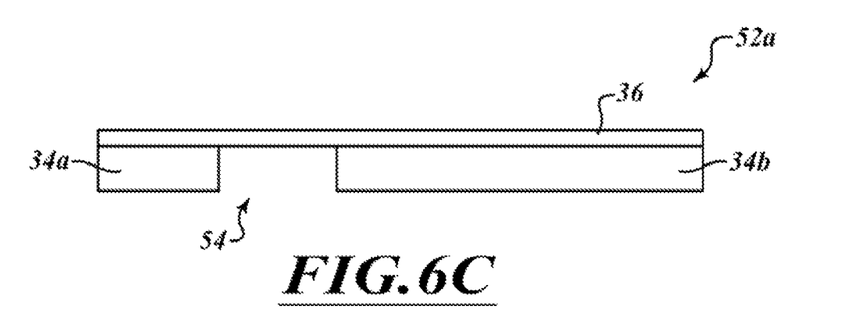
Figure 6D:
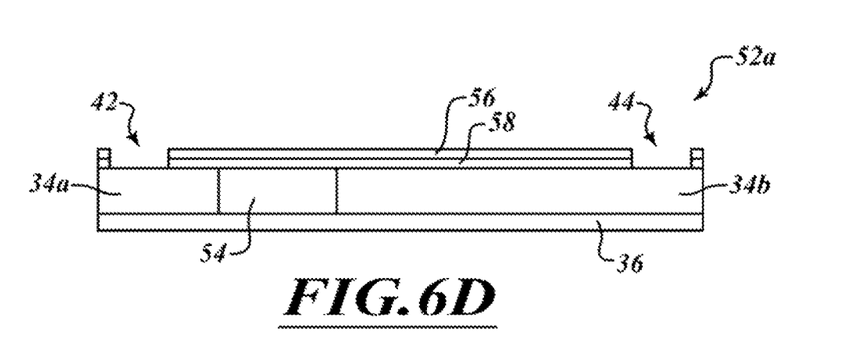

FIGS. 6A-6D illustrate a process for forming a protective structure 52a according to one embodiment. In FIG. 6A, a single piece of transparent glass has been sawed to separate transparent components 34a and 34b from each other. A layer of tape 60 is also sawed when the transparent component is sawed. In FIG. 6B, the optical film 36 is attached to the transparent components 34a and 34b. In FIG. 6C, the tape 60 has been removed. In FIG. 6D, the protective structure 52a is flipped over so that the optical film 36 is now on the bottom. The protective baffle is attached to the first and second transparent components 34a and 34b through the baffle tape 58. Apertures 42 and 44 have been formed previously in the baffle 56. The protective component 52 is now ready to be placed in an optical sensor as shown in FIG. 2A.

Figure 7A:
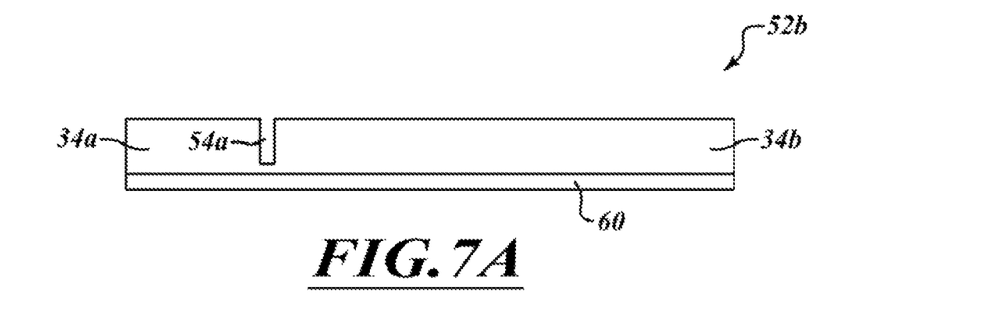
FIGS. 7A-7C illustrate steps for forming a protective structure including trenches formed in a transparent component thereof according to one embodiment.
Figure 7B:
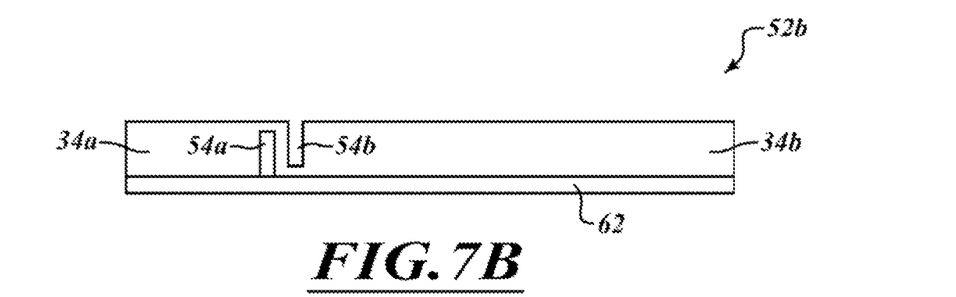

FIGS. 7A-7C illustrate a process for forming a protective structure 52b including a single integral transparent component 34, including transparent components 34a and 34b. In FIG. 7A, the transparent component 34 has been placed on tape 60 and a first trench 54a has been formed in a surface of the transparent component 34. Trench 54a can be formed by sawing, drilling, etching, or in any other suitable manner. In FIG. 7B, the tape 60 has been removed, tape 62 has been applied, and the transparent component 34 has been flipped.

Second trench 54b is formed in the opposite surface of the transparent component 34 from the first trench 54a. The second trench 54b can be formed in the same manner as the first trench 54a. The positioning of the first and second trenches relative to each other is such that when filled with molding compound or another opaque material as described previously, light from the second integrated circuit die 26 cannot pass through the trenches 54 and 54b, and yet the trenches are not formed all the way through the surface so as to completely sever transparent components 34a and 34b from each other. This allows the transfer component 34 to be robust.

Figure 7C:
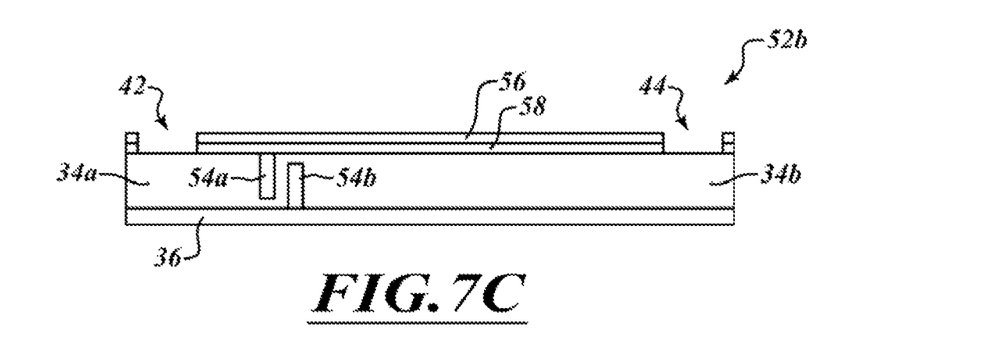

In FIG. 7C, the tape 62 has been removed, the protective structure 52b has been flipped, and optical film 36 has been placed on the bottom surface of the protective structure 52b. The baffle 56 is then attached to the transparent component 34 by way of the baffle tape 58. Apertures 42 and 44 are formed prior to attachment of the baffle 56 to the transparent component 34. The protective structure 52 is now ready to be placed in an optical sensor 20b as shown in FIG. 3. Molding compound can then be applied, filling the openings 54a and 54b and encompassing the optical sensor in molding compound 48.

While particular configurations, structures and materials have been described, many other materials, configurations, and structures for an optical sensor 20 are possible in light of the present disclosure. Many combinations and variations are possible as will be apparent to those of skill in the art in view of the present disclosure. All such variations, structures, and combinations fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device comprising:
a substrate;
a light sensing component on to the substrate;
a light emitting component on the substrate; and
a protective structure on the light sensing component and the light emitting component, the protective structure including:
   a first transparent component on the light sensing component;
   a second transparent component on the light emitting component; and
   an opaque cap on the first and second transparent components, the opaque cap having a first aperture over the light sensing component and a second aperture over the light emitting component, the protective structure configured to permit light emitted from the light emitting component to pass through the second aperture and to permit light to pass through the first aperture to the light sensing component; and
   a transparent optical tape coupling the first and second transparent components to the light sensing component and the light emitting component, respectively.

2. The device of claim 1 comprising:
a first opening between the first and second transparent components; and
an opaque material positioned in the first opening to prevent light emitted from the light emitting component to pass to the light sensing component without passing through the first aperture.

3. A device comprising:
a substrate;
a light sensing component on to the substrate;
a light emitting component on the substrate; and
a protective structure on the light sensing component and the light emitting component, the protective structure including:
   a first transparent component on the light sensing component;
   a second transparent component on the light emitting component, wherein the first and second transparent components are a unitary structure;
   a first trench formed in a top surface of the unitary structure; and
   an opaque cap on the first and second transparent components, the opaque cap having a first aperture over the light sensing component and a second aperture over the light emitting component, the protective structure positioned to permit light emitted from the light emitting component to pass through the second aperture and to permit light to pass through the first aperture to the light sensing component.

4. The device of claim 3 comprising a second trench formed in a bottom surface of the unitary structure, the opaque material being positioned in the first and second trenches.

5. The device of claim 4 wherein the unitary structure includes a third transparent component connecting the first and second transparent components.

6. The device of claim 2 wherein the first and second transparent components are isolated from each other by the opaque material.

7. The device of claim 2 wherein the opaque material is molding compound.

8. The device of claim 1 wherein the protective structure includes a second tape coupling the opaque cap to the first and second transparent components, the first and second apertures also being formed in the second tape.

9. The device of claim 1 wherein the first and second transparent components are glass.

10. The device of claim 1 wherein the opaque cap is plastic.

11. A device comprising:
a first integrated circuit die on a substrate;
a second integrated circuit die on the substrate;
a transparent component on the first and second integrated circuit dies;
a transparent optical film coupling the transparent component to the first and second integrated circuit dies; and
an opaque cap on the transparent component, the opaque cap having a first aperture over the first integrated circuit die and a second aperture over the second integrated circuit die.

12. The device of claim 11 comprising:
an opening in the transparent component; and
an opaque material positioned in the opening.

13. The device of claim 12 wherein first integrated circuit die includes a light sensor, the second integrated circuit die including a light emitter.

14. The device of claim 13 wherein the first aperture is configured to allow light to pass therethrough to the first integrated circuit die.

15. The device of claim 14 wherein the second aperture is configured to allow light emitted from the second integrated circuit die to pass through the second aperture.

16. The device of claim 15 wherein the opaque material inhibits light emitted from the second integrated circuit die from reaching the first integrated circuit die without first passing through the first opening.

17. The device of claim 1 wherein the optical tape extends from the light emitting component to the light sensing component.

* * * * *